(12) United States Patent
Murai et al.

(10) Patent No.: US 8,043,953 B2
(45) Date of Patent: Oct. 25, 2011

(54) SEMICONDUCTOR DEVICE INCLUDING AN LSI CHIP AND A METHOD FOR MANUFACTURING THE SAME

(75) Inventors: Hideya Murai, Minato-ku (JP); Yuji Kayashima, Kawasaki (JP); Takehiko Maeda, Kawasaki (JP); Shintaro Yamamichi, Minato-ku (JP); Takuo Funaya, Minato-ku (JP)

(73) Assignee: Renesas Electronics Corporation, Kanagawa (JP)

( * ) Notice: Subject to any disclaimer, the term of this patent is extended or adjusted under 35 U.S.C. 154(b) by 148 days.

(21) Appl. No.: 12/521,936

(22) PCT Filed: Jan. 15, 2008

(86) PCT No.: PCT/JP2008/050343
§ 371 (c)(1),
(2), (4) Date: Jul. 1, 2009

(87) PCT Pub. No.: WO2008/093531
PCT Pub. Date: Aug. 7, 2008

(65) Prior Publication Data
US 2009/0294951 A1    Dec. 3, 2009

(30) Foreign Application Priority Data
Jan. 29, 2007   (JP) ............................... 2007-018141

(51) Int. Cl.
*H01L 21/44* (2006.01)
*H01L 21/4763* (2006.01)

(52) U.S. Cl. .......................... 438/599; 438/612; 438/637
(58) Field of Classification Search .................. 438/599, 438/612, 637; 257/E23.011, E23.017, E23.077
See application file for complete search history.

(56) References Cited

U.S. PATENT DOCUMENTS

| RE41,369 E | * | 6/2010 | Jobetto | 257/759 |
| 2001/0004134 A1 | * | 6/2001 | Saitoh | 257/759 |
| 2001/0038145 A1 | * | 11/2001 | Mashino | 257/707 |
| 2004/0014317 A1 | | 1/2004 | Sakamoto et al. | |
| 2004/0130013 A1 | | 7/2004 | Sunohara et al. | |
| 2005/0042801 A1 | | 2/2005 | Sunohara et al. | |
| 2008/0017925 A1 | * | 1/2008 | Yamaguchi et al. | 257/350 |
| 2008/0083830 A1 | * | 4/2008 | Tokunaga et al. | 235/492 |

FOREIGN PATENT DOCUMENTS

| JP | 2001-094264 A | 4/2001 |
| JP | 2002-246504 A | 8/2002 |
| JP | 2003-007896 A | 1/2003 |
| JP | 2004-087991 A | 3/2004 |
| JP | 2004-165277 A | 6/2004 |
| JP | 2005-332887 A | 12/2005 |

* cited by examiner

*Primary Examiner* — Ngan Ngo
(74) *Attorney, Agent, or Firm* — Sughrue Mion, PLLC (57) ABSTRACT

A semiconductor device that can be readily manufactured, can include a large number of pads, and can be thin, and a method for manufacturing the same are provided. The semiconductor device is characterized in that the semiconductor device includes an LSI chip, an insulating layer provided on the LSI chip and made of a nonphotosensitive resin, the insulating layer including a via hole in the position corresponding to an externally connected pad, and a wiring layer extending along the insulating layer through the via hole to the externally connected pad, and at least part of the via hole is formed by irradiating the insulating layer with laser light.

7 Claims, 7 Drawing Sheets

SEMICONDUCTOR DEVICE INCLUDING AN LSI CHIP AND A METHOD FOR MANUFACTURING THE SAME

TECHNICAL FIELD

The present invention relates to a semiconductor device including an LSI chip and a method for manufacturing the same, and particularly to a semiconductor device that is readily manufactured, provides a high yield, and excels in reliability, and a method for manufacturing the same.

BACKGROUND ART

Recently, attention has paid to a semiconductor device called a "substrate with a built-in chip" in which a individually divided LSI chip and the like are buried in a substrate made of resin and the like and a semiconductor device in which an insulating resin layer and a wiring layer are formed on an LSI chip. In semiconductor devices such as a substrate with a built-in chip, it is necessary to bury a chip in a substrate made of resin and the like, then laminate an insulating layer over the substrate, and further form a via hole through the insulating layer to electrically connect an electrode pad on the chip to an external electric terminal and the like.

An example of a method for forming a via hole through an insulating layer includes a method for forming an insulating layer made of a photosensitive resin on a substrate with a built-in chip, exposing the photosensitive resin to light, and developing the photosensitive resin to form a via hole. The mechanical strength of a photosensitive resin is, however, typically so low that the device is often disadvantageously unreliable. Further, many sheet-shaped resin materials used to form the insulating layer are nonphotosensitive resins. Since photosensitive resins are not produced in volume, the use of a photosensitive resin disadvantageously increases the cost.

On the other hand, nonphotosensitive resins are frequently used as sheet-shaped insulating materials used in printed wiring boards and the like. Nonphotosensitive resins are therefore produced in volume, and the use of a nonphotosensitive resin can reduce the cost. When a nonphotosensitive resin is used to form an insulating layer in a semiconductor device with a built-in chip, however, there is a problem of how to form a via hole.

That is, when a nonphotosensitive resin is used, a via hole is typically formed by using a laser beam. In this case, a laser beam passes through the insulating layer made of a nonphotosensitive resin, and an electrode pad located under the insulating layer and made of Al and the like is flied apart by irradiation of the laser beam. As a result, the device including a semiconductor chip is disadvantageously damaged.

Figure 6:
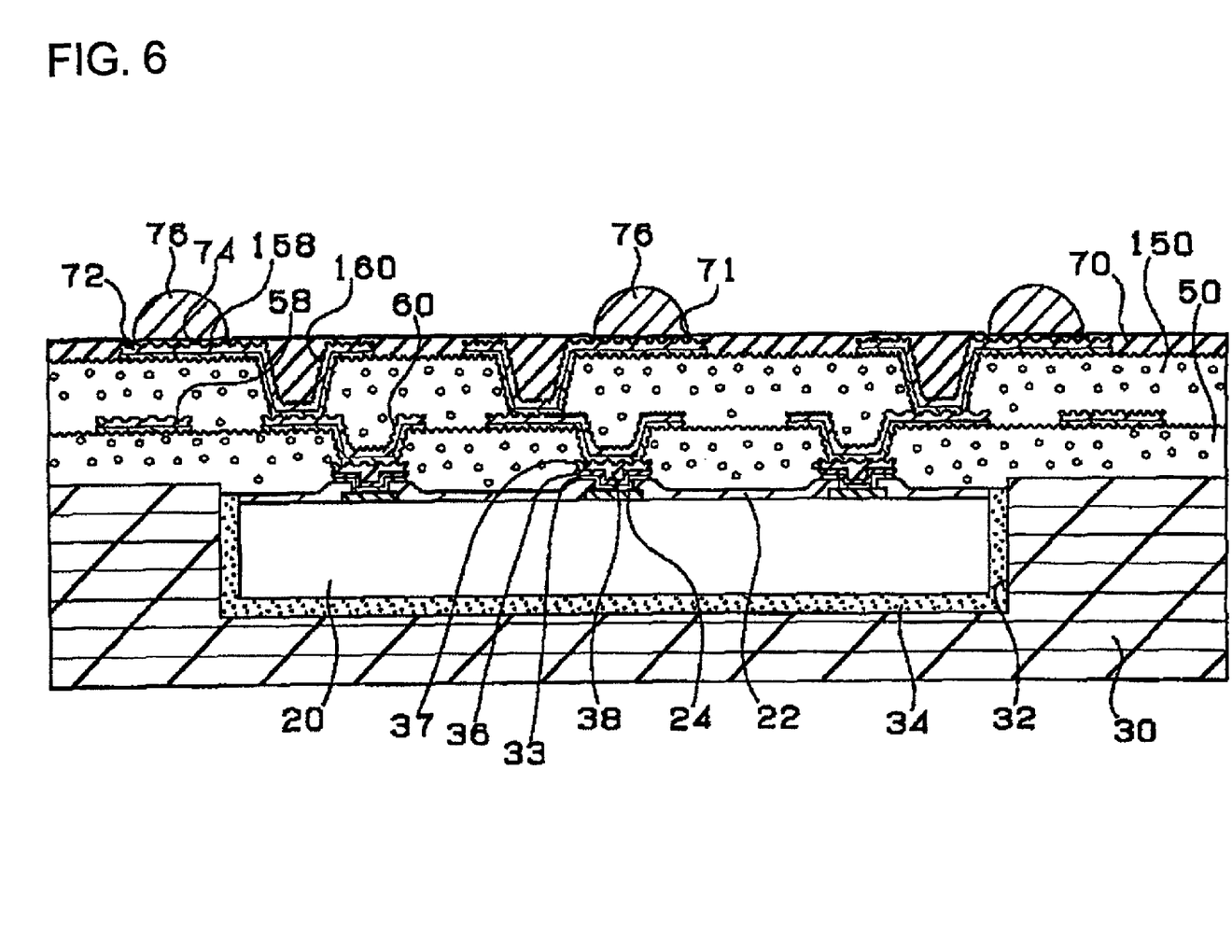
FIG. 6 explains a semiconductor device of relate art.

To solve such a problem, in the printed wiring technology disclosed in Japanese Patent Laid-Open No. 2003-7896 (FIG. 6), transition layer (A) is provided as a laser stopper layer. The transition layer is comprised of at least two metal layers (33, 36, and 37) and larger than die pad (24) of IC chip (20), which is a semiconductor element. The technology described in Japanese Patent Laid-Open No. 2003-7896 thus allows a laser beam to form a via hole without damage to the die pad (paragraph number (0009)).

Figure 7:
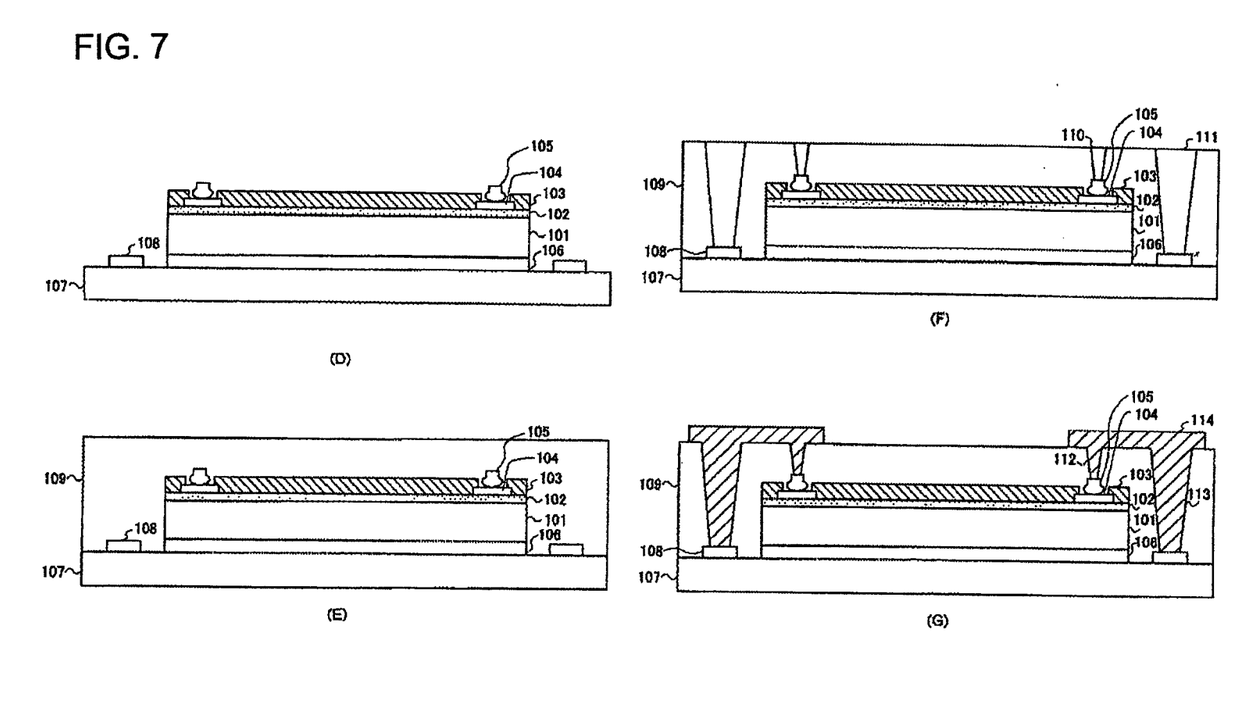
FIG. 7 explains a semiconductor device of relate art.

On the other hand, in the printed wiring technology described in Japanese Patent Laid-Open No. 2005-332887, stud bump 105 is formed on electrode pad 104 on chip 101, and insulating layer 109 made of epoxy and the like is laminated over the stud bump. A laser machining is then performed to form via hole 110 that reaches the stud bump (FIG. 7).

In this technology, since stud bump 105 serves as a stopper layer in the laser machining, electrode pad 104 will not be directly irradiated with the laser beam. Therefore, the electrode pad is not flied apart by the laser beam, or the device including a semiconductor chip is not damaged (paragraph numbers (0022) and (0062)).

DISCLOSURE OF THE INVENTION

The related art illustrated in Japanese Patent Laid-Open No. 2003-7896 and Japanese Patent Laid-Open No. 2005-332887, however, has the following problems:

That is, the formation of the protective pattern described in Japanese Patent Laid-Open No. 2003-7896 involves resist application or attachment, resist patterning, wet processing for removing the resist, and other steps. The steps are therefore complicated, disadvantageously resulting in increase in cost. Further, the material cost the resist material, chemicals for the wet processing, and the like disadvantageously add extra cost. Moreover, since the transition layer needs to be larger than the die pad (electrode pad), the inter-pad distance preliminarily needs to have a little large margin in consideration of the large transition layer, resulting in occurrence of problem in which number of pads is insufficient in the whole semiconductor device.

On the other hand, the method described in Japanese Patent Laid-Open No. 2005-332887 does not require the resist patterning and the like, but an extra step of forming a stud bump. Since the stud bump has a certain height, the resin layer needs to be thicker than the stud bump, that is, the minimum resin thickness needs to be equal to or greater than the height of the stud bump. This imposes a structural constraint on the thickness of the insulating layer, which needs to be greater than the height of the bump. The method is unsuitable for mobile apparatus and other applications in which the semiconductor device is preferably as thin as possible. Further, the stud bump, which is typically circular, needs to cover the pad (which may not be circular) in the underlying layer in order to block the laser beam, disadvantageously resulting in occurrence of problem in which number of pads is insufficient in the whole semiconductor device.

Moreover, the technologies disclosed in Japanese Patent Laid-Open No. 2003-7896 and Japanese Patent Laid-Open No. 2005-332887 relate to a printed wiring technology, and it is therefore difficult to apply them as they are to a substrate with a built-in chip, which completely differs in the size of wiring, the form of the entire substrate, and the like.

The present invention has been made to solve the above problems. An object of the present invention is to provide a semiconductor device that can be readily manufactured, can include a large number of pads, and can be thin, and a method for manufacturing the same.

To solve the above problems, a typical aspect of the present invention relates to a semiconductor device, comprising:

a individually divided LSI chip including an externally connected pad;

an insulating layer provided on the LSI chip and made of a nonphotosensitive resin, the insulating layer including a via hole in a position corresponding to the externally connected pad; and a wiring layer extending along the insulating layer through the via hole to the externally connected pad, wherein at least part of the via hole is formed by irradiating the insulating layer with laser light.

Another typical aspect of the present invention relates to a method for manufacturing a semiconductor device, comprising:

(1) preparing a individually divided LSI chip including an externally connected pad;

(2) forming an insulating layer made of a nonphotosensitive resin on the LSI chip;

(3) irradiating a position on the insulating layer corresponding to the externally connected pad with laser light, to remove the insulating layer and then to form a via hole passing through the insulating layer so that the externally connected pad is exposed; and (4) forming a wiring layer extending along the insulating layer through the via hole to the externally connected pad.

Another typical aspect of the present invention relates to a method for manufacturing a semiconductor device, comprising:

(A) preparing a individually divided LSI chip including an externally connected pad;

(B) forming an insulating layer made of a nonphotosensitive resin on the LSI chip;

(C) irradiating a position on the insulating layer corresponding to the externally connected pad with laser light, to form an opening in the insulating layer in such a way that part of the insulating layer is left in the position corresponding to the externally connected pad;

(D) carrying out dry etching or wet etching at bottom of the opening, to remove the insulating layer left in the position corresponding to the externally connected pad, and then to form a via hole passing through the insulating layer so that the externally connected pad is exposed (E) forming a wiring layer extending along the insulating layer through the via hole to the externally connected pad.

No LSI wiring or semiconductor element will be damaged during the via hole formation using a laser beam, and a large number of pads can be ensured. Further, a semiconductor device that is readily manufactured, provides a high yield, and excels in reliability can be provided.

DESCRIPTION OF SYMBOLS

1: LSI chip
2: externally connected pad
3: nonphotosensitive resin
4: via hole
5: wiring layer
6: remaining insulating layer

BEST MODE FOR CARRYING OUT THE INVENTION

An exemplary embodiment will be described below with reference to the drawings to clarify the features and advantages of a semiconductor device and a method for manufacturing the same according to the present invention.

(Semiconductor Device)

Figure 1:
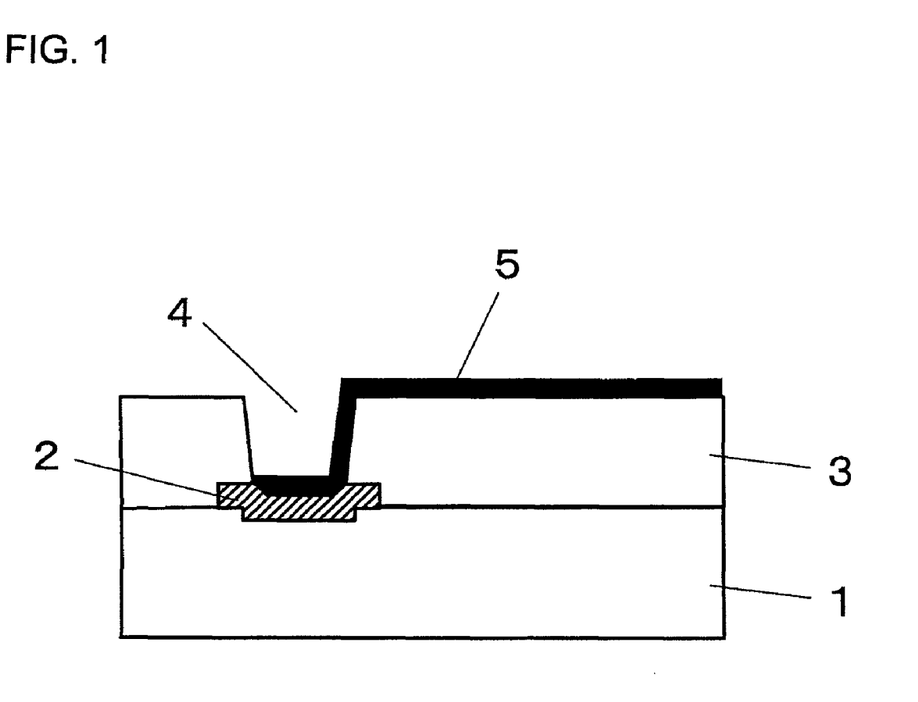
FIG. 1 is a cross-sectional view of an example of a semiconductor device of the present invention.

FIG. 1 is a cross-sectional view of an example of a semiconductor device of the present invention. As shown in FIG. 1, the semiconductor device of the present invention comprises insulating layer 3 including via hole 4 formed in the position on individually divided LSI chip 1 including externally connected pad 2 that corresponds to the pad. Wiring layer 5 extending along insulating layer 3 through via hole 4 to externally connected pad 2 and electrically connected thereto, is formed. The insulating layer is made of a nonphotosensitive resin, and at least part of the via hole is directly formed above the externally connected pad by laser light irradiation.

The structure in which at least part of the via hole is directly formed above the externally connected pad by laser light irradiation allows the semiconductor device of the present invention to be readily manufactured, provided with a large number of pads, and operated in a stable manner. Also, at least part of the via hole is formed above the externally connected pad by laser light irradiation. Directly forming at least part of the via hole above the externally connected pad this way without providing a laser stopper layer allows the steps to be simplified. Further, providing no laser stopper layer eliminates the need to address misalignment between the externally connected pad and the laser stopper layer and the like. A plurality of externally connected pads can therefore be provided at short spacings, whereby the number of externally connected pads on the chip can be maximized.

All the via holes are preferably formed only by laser irradiation. In this case, the laser irradiation conditions are adjusted in accordance with the material of the insulating layer so that the via holes are formed to be deep enough to reach the respective externally connected pad, that is, to expose the externally connected pads, but the externally connected pads are not damaged by the laser irradiation. Forming the via holes by laser irradiation to be deep enough to reach the respective externally connected pads allows the advantageous effects described above to be more effectively achieved.

In general, LSIs are formed all at once on a wafer, and the "LSI chips" of the present invention are obtained, for example, by dicing the thus formed LSIs into individually divided ones. The externally connected pads are also preferably formed all at once on the wafer before the dicing.

The material of the insulating layer is not limited to a specific one but may be any nonphotosensitive resin. The material is, however, preferably an epoxy resin, which is a thermoset resin, or a polyimide resin, which excels in heat resistance. Other examples of the material of the insulating layer include a liquid crystal polymer, a cardo resin, polyolefin, polyacrylate, polyamide, and a variety of other resin materials. The resin material may be comprised of only a resin. Another preferable resin material may also contain a variety of organic or inorganic fillers, glass cloth, alamido fibers, or other suitable fibrous reinforcing members.

The preferable thickness of insulating layer can be selected as appropriate in consideration of electric characteristics such as the insulating property, characteristic impedance, and mechanical characteristics such as crack occurrence in a reliability test. The insulating layer may be a monolayer or a multilayer. The thickness of an insulating monolayer or an insulating multilayer preferably ranges from 1 μm to 500 μm inclusive, more preferably from 5 μm to 200 μm inclusive, still more preferably from 10 μm to 50 μm.

The "externally connected pad" in the present invention is a pad for electrically connecting the LSI fabricated in the vicinity of the surface of the LSI chip to external components, and electrically connected to any of a power source, a ground line, a signal line, and other components. The cross-sectional diameter of the externally connected pad depends on the size of the LSI chip and the number of terminals to be connected and typically ranges from several micrometers to several hundred micrometers inclusive. For example, the diameter can be on the order of several ten micrometers. The cross-sectional shape of the externally connected pad can be a circle, an ellipse, an octagon, a rectangle, or other polygonal shapes.

The cross-sectional diameter of each of the via holes depends on the size of the corresponding externally connected pad and the distance to the adjacent externally connected pad, and typically ranges from several micrometers to several hundred micrometers inclusive. That is, when the size of the pad or the distance to the adjacent pad is small, the size of the via hole tends to decrease and ranges from several micrometers to several ten micrometers. On the other hand, when the size of the pad or the distance to the adjacent pad is large, the size of the via hole tends to increase and ranges from several ten micrometers to several hundred micrometers. The cross-sectional shape of the via hole is typically a circle, but can be a shape close to an ellipse or a polygon. Since the via hole has a function of connecting to the wiring in an underlying layer, the depth of the via hole is equal to the thickness of the insulating layer or substantially equal to the thickness of the insulating layer from which the thickness of wiring in the underlying layer is subtracted.

Examples of the laser used for the via hole formation may include an Nd-YAG laser, a $CO_2$ laser, and an excimer laser. A via hole formed above a chip is smaller than a via hole used in a printed wiring board in many cases. An Nd-YAG laser (third harmonic) or an excimer laser, which can form a via hole smaller than or equal to several ten micrometers in diameter, is therefore preferably used. Since the diameter of a via hole that can be formed by a laser depends on the wavelength of the laser, an excimer laser or a UV-YAG laser is preferably used to form a small via hole. On the other hand, a $CO_2$ laser is preferably used to form a large via hole.

The "position on the insulating layer that corresponds to the externally connected pad" means that the position of the externally connected pad coincides with (corresponds to; is aligned with) the position of the via hole, and it is particularly important that the bottom of the via hole is aligned with the pad. If the bottom of the via hole is misaligned with the pad, the laser beam directly damages the layer under the pad, resulting in destruction of the LSI wiring, the semiconductor element, and the like in the underlying layer.

The wiring connected to the externally connected pad through the via hole may be monolayer or multilayer wiring. A resin layer may further be formed on the top layer to cover at least part of the wiring. The wiring layer is preferably made of Cu.

The thickness of the wiring can be selected as appropriate in consideration of electric characteristics such as characteristic impedance and mechanical characteristics such as disconnection occurrence in a reliability test. Specifically, the thickness of the wiring preferably ranges from 0.1 μm to 100 μm inclusive, more preferably from 1 μm to 50 μm inclusive, still more preferably from 5 μm to 20 μm inclusive.

In the semiconductor device of the present invention, the LSI chip is typically mounted on a substrate, and the LSI chip is electrically connected to the wiring above the substrate via the externally connected pad and the wiring layer extending from inside the via hole onto the insulating layer. The substrate on which the LSI chip is mounted forms a "substrate with a built-in chip." The substrate on which the LSI chip is mounted is made of an epoxy resin, a BT resin, a phenol resin, or any other suitable resin impregnated with reinforcing material such as a glass-epoxy resin or core material, a layered prepreg impregnated with an epoxy resin, and the like or any other material typically used in a printed wiring board. Other examples may include a double-sided copper-clad laminate, a single-sided sheet, a resin sheet without a metal film, and a resin film as the substrate.

Figure 2:
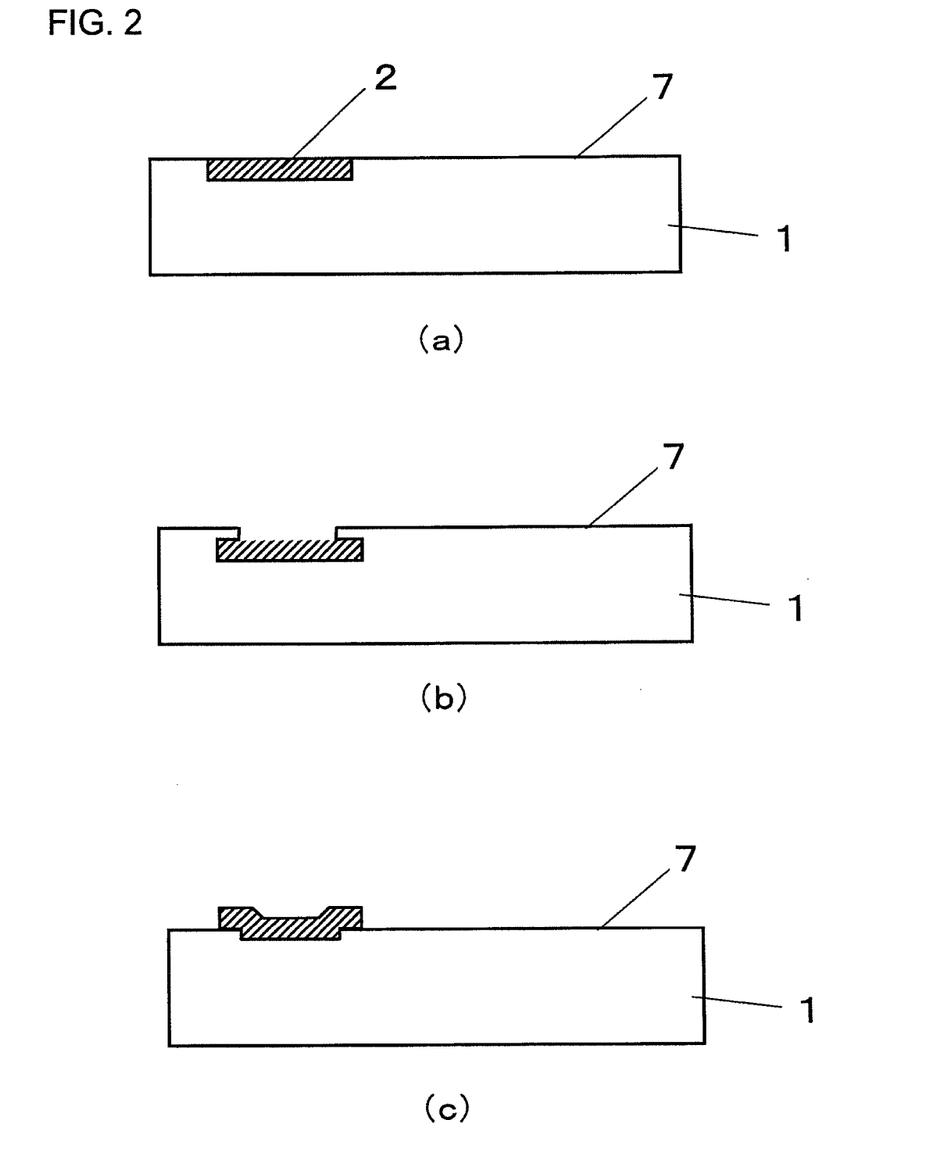
FIG. 2 includes cross-sectional views showing part of the semiconductor device of the present invention.

The externally connected pad of the semiconductor device according to the present invention preferably includes the same surface as a reference surface of the LSI chip. Alternatively, the entire or part of the externally connected pad may be located on the LSI chip side under the reference surface of the LSI chip (FIG. 2). The reference surface of the LSI chip used in the present invention means the final surface (front surface) of the LSI chip formed in an LSI front-end step. Specifically, the reference surface of the LSI chip means the upper surface of a global wiring layer, which is the final metal layer formed in the front-end step, or the upper surface of an insulating layer (excluding the insulating layer made of a nonphotosensitive resin in which a via hole is formed according to the present invention) formed on the global wiring layer and made of silicon oxide, silicon nitride, and the like. That is, the reference surface is the surface where the LSI chip comes into contact with the insulating layer made of a nonphotosensitive resin and formed with a via hole thereon.

In general, a semiconductor element is formed in the first layer of an Si wafer that has undergone oxidation and other processes, and the externally connected pad and the like are formed over the semiconductor element. Therefore, the "LSI chip side" corresponds to the Si wafer side away from the reference surface (opposite the insulating layer made of a nonphotosensitive resin and formed with a via hole thereon). That is, in this case, part of the externally connected pad includes the same surface as the reference surface of the LSI chip, or the entire or part of the externally connected pad is located under the reference surface (on the Si wafer side, on the LSI chip side, or on the side opposite the insulating layer made of a nonphotosensitive resin and formed with a via hole thereon). "The entire externally connected pad is located under the reference surface" means that the externally connected pad is located completely under the reference surface.

FIG. 2 shows examples of the externally connected pad. In FIG. 2, the via hole, the insulating layer, the wiring layer, and the like are omitted. FIG. 2(a) shows a case where the upper surface of the externally connected pad coincides with (includes the same surface as) reference surface 7 of the LSI chip. FIG. 2(b) shows a case where the entire externally connected pad is located on the LSI chip side under reference surface 7 of the LSI chip. FIG. 2(c) shows a case where part of the externally connected pad is located on the LSI chip side under reference surface 7 of the LSI chip.

When the entire or part of the present invention is located on the LSI chip side under the reference surface of the LSI chip, the externally connected pad is formed by the front-end step. The externally connected pad is therefore formed on a surface planarized in a damascene step or any other suitable step, advantageously resulting in excellent flatness, stable via hole formation in the via hole machining step using laser irradiation, and highly reliable connection.

In the semiconductor device of the present invention, the externally connected pad preferably includes a layer primarily containing Al. The layer primarily containing Al is a layer the Al content of which is at least 50% in terms of atomic ratio. Al—Si, Al—Cu, Al—Si—Cu, and other aluminum alloys can be used as well as Al alone. Using the alloys described above advantageously have better electromigration resistance and corrosion resistance than Al alone. The externally connected pad primarily containing Al is highly conformable to LSI manufacturing steps, whereby the yield of the semiconductor device can be high. The externally connected pad may be comprised of only a layer primarily containing Al or a layer primarily containing Al combined with other layers.

The melting point of Al is approximately 660° C., which is approximately only one-half the melting points of Cu and the like. Therefore, when Al is simply irradiated with a laser beam, Al will be flied apart. The laser irradiation therefore needs to be carried out under the conditions in which Al is will not be flied apart.

In the semiconductor device of the present invention, the externally connected pad may alternatively include a layer primarily containing Cu. The layer primarily containing Cu is a layer the Cu content of which is at least 50% in terms of atomic ratio. Cu is used as a wiring forming material in the front-end step and readily formed in the processes in the front-end step. The externally connected pad primarily containing Cu is highly conformable to LSI manufacturing steps, whereby the yield of the semiconductor device can be high. The externally connected pad may be comprised of only a layer primarily containing Cu or a layer primarily containing Cu combined with other layers.

The externally connected pad is preferably a wire bonding pad (preferably also serves as a wire bonding pad). To allow the externally connected pad to serve as a wire bonding pad, the cross-sectional size and shape of the externally connected pad preferably suit wire bonding. An example of the cross-sectional size and shape suitable for wire bonding may be a rectangle the short side or long side of which is approximately 100 μm in length. For example, such rectangles may be regularly arranged around the chip. Normal wire bonding connection or wiring connection after forming via holes can be used in a single LSI chip by using the externally connected pads as wire bonding pad.

Since quite a large number of LSI chips can be typically obtained from a single wafer, sufficient amount of demand is required. When the externally connected pad also allows wire bonding connection as described above, the same chip can satisfy the following demands: wire bonding connection and wiring connection after via holes are formed, resulting in increase in consumption and cost reduction. Further, laser light irradiation increases the thickness of a surface oxide layer, advantageously resulting in improvement in desmear resistance and the like of the Al layer.

The thickness of the externally connected pad can have a variety of values. It is, however, preferable that the externally connected pad has a certain thickness in consideration of damage due to laser light, preferably at least 1.0 μm. When the thickness of the pad is smaller than 1.0 μm, laser light may damage the externally connected pad. Further, to use the externally connected pad as a wire bonding pad, the externally connected pad needs to be thick enough to withstand wire bonding operation. In consideration of this as well as the reason described above, the thickness is preferably at least 1.0 μm. When the externally connected pad is at least 1.0 μm in thickness, the damage to the underlying semiconductor element and other components due to laser light can be reduced and suppressed. The resultant higher laser light irradiation energy acceptance level prevents the semiconductor element, the wiring, and the like from being damaged, whereby the semiconductor device has excellent reliability.

When the externally connected pad is comprised of a layer primarily containing Al, the externally connected pad is often fabricated by combining sputtering and dry etching. In this case, when the externally connected pad has a thickness greater than 10 μm, it is difficult to manufacture the is externally connected pad. Therefore, the thickness of the externally connected pad is preferably 10 μm or smaller, more preferably 5 μm or smaller. On the other hand, the lower limit of the thickness is preferably at least 1.0 μm in order to provide stable electric characteristics.

When the externally connected pad is comprised of a layer primarily containing Cu, the externally connected pad is formed also by sputtering and dry etching processes as part of the semiconductor front-end step or by using apparatus similar to those used in the front-end step. When the externally connected pad has a thickness greater than 10 μm, it is again difficult to manufacture the externally connected pad. Therefore, the thickness of the externally connected pad is preferably 10 μm or smaller, more preferably 5 μm or smaller. On the other hand, the lower limit of the thickness is preferably at least 1.0 μm, as in the case of Al. However, since Cu has a higher melting point and hence higher heat resistance than Al, the thickness may be at least 0.5 μm in some cases. In particular, when a Cu pad is formed in the same layer as the outermost-layer wiring (global wiring), the thickness can be approximately 0.5 μm.

The nonphotosensitive resin that forms the insulating layer preferably has a 95% decomposition temperature lower than the melting point of the material that forms the externally connected pad. The reaction in which a nonphotosensitive resin decomposes is an endothermic reaction, and the heat of decomposition is probably transferred from the surrounding system during the decomposition. Therefore, when the 95% decomposition temperature is lower than or equal to the melting point of the material that forms the externally connected pad, the material will not probably deform due to the heat. Further, the damage to the underlying layer is reduced because the temperature of the via hole portion will not rise in the temperature in which the nonphotosensitive resin decomposes. As a result, the semiconductor device can provide stable connection and high reliability.

When the externally connected pad is made of Al, the melting point thereof is approximately 660° C., and it is preferable that at least 95% of the nonphotosensitive resin decomposes at a temperature lower than or equal to the melting point. When the nonphotosensitive resin contains inorganic fillers (such as fibrous reinforcing members) made of silica and the like, the 95% decomposition temperature is determined by calculating whether or not 95% of the resin component excluding the inorganic fillers has decomposed. The 95% decomposition temperature of the nonphotosensitive resin is measured in compliance with the JIS K7120 method. Specifically, the 95% decomposition temperature is defined by preparing a predetermined amount (approximately 10 mg) of a nonphotosensitive resin, and measuring the reduction in mass thereof when subjected to heat by using a thermobalance to find the point where the mass decreases by 95%.

Method for Manufacturing Semiconductor Device

A first method for manufacturing a semiconductor device according to the present invention includes the following steps:
(1) a step of preparing a individually divided LSI chip including an externally connected pad;
(2) a step of forming an insulating layer made of a nonphotosensitive resin on the LSI chip;

(3) a step of irradiating a position on the insulating layer corresponding to the externally connected pad with laser light, to remove the insulating layer and then to form a via hole passing through the insulating layer so that the externally connected pad is exposed; and (4) a step of forming a wiring layer extending along the insulating layer through the via hole to the externally connected pad.

Figure 3:
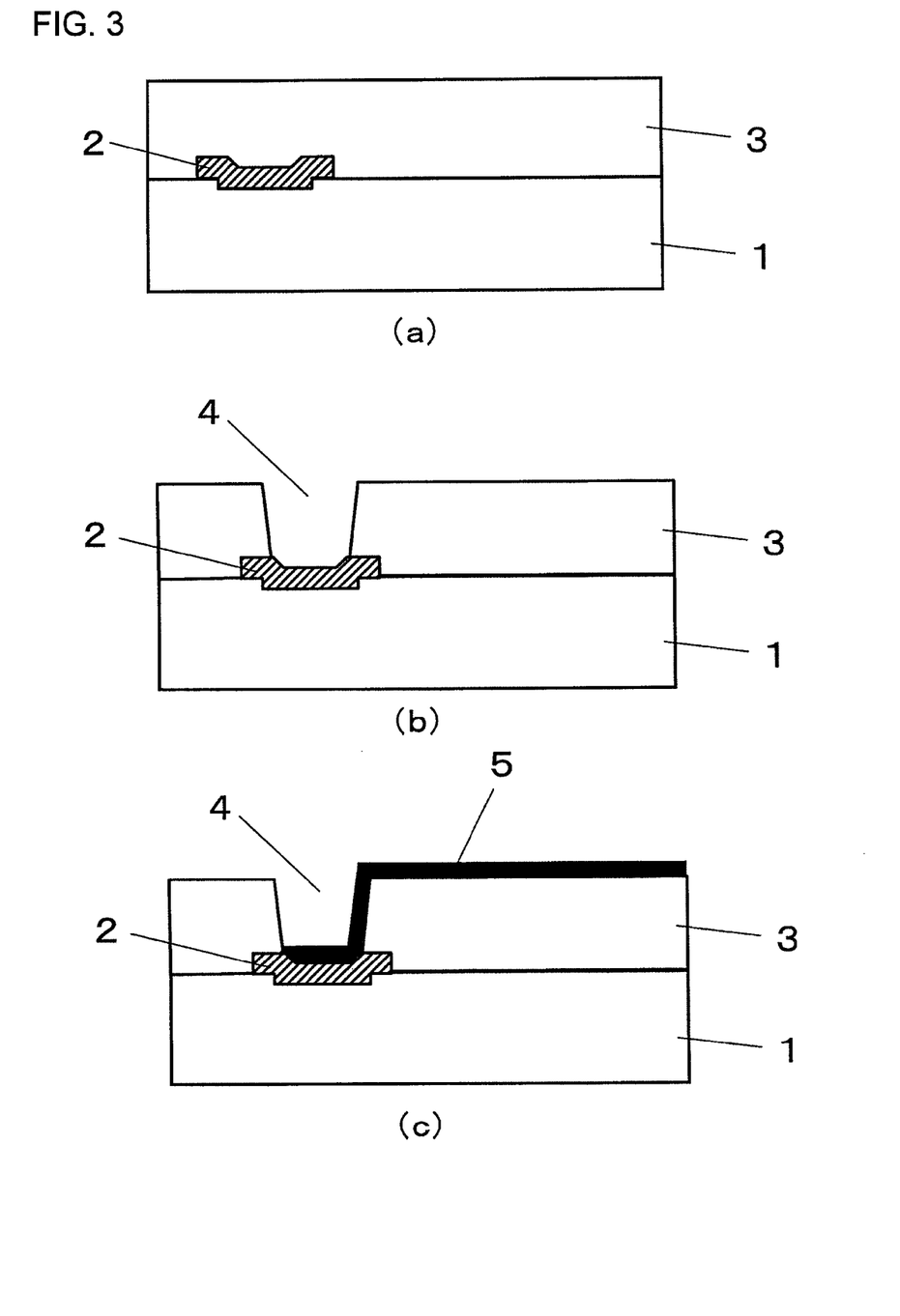
FIG. 3 shows an example of a method for manufacturing a semiconductor device according to the present invention.

FIG. 3 shows an example of the first method for manufacturing a semiconductor device. First, individually divided LSI chip 1 including externally connected pad 2 is prepared (step (1)). The LSI chip including the externally connected pad can be prepared by forming outermost-layer wiring (global wiring) of the LSI and then forming the externally connected pad made of Al and the like, for example, by using sputtering. In this process, the externally connected pad may be formed after a protective layer made of a resin and the like was formed in advance. Alternatively, the externally connected pad may be formed by stacking a plurality of conductive materials, such as Al and TiN.

Figure 4:
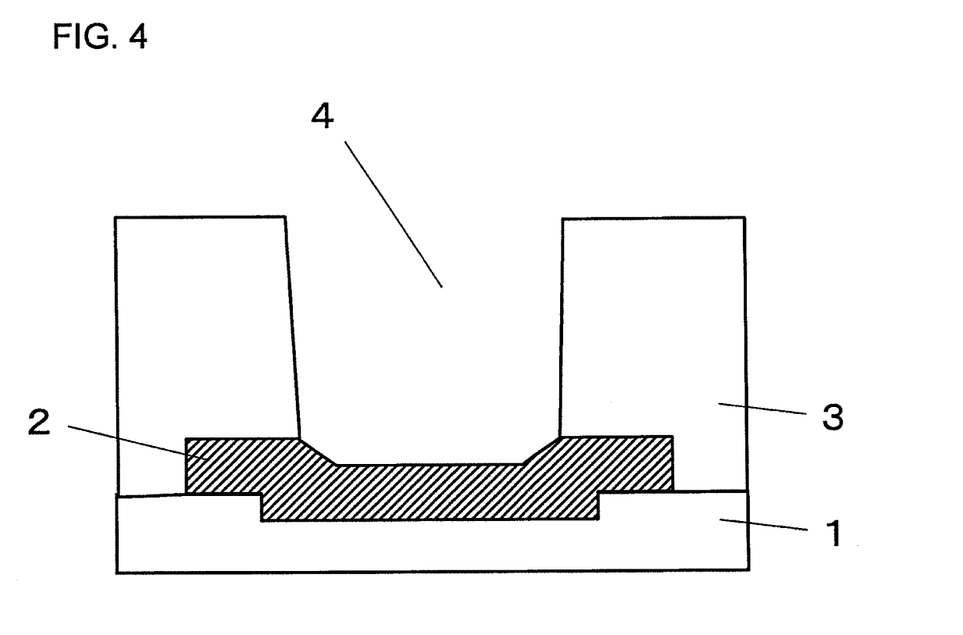
FIG. 4 shows another example of the method for manufacturing a semiconductor device according to the present invention.

Insulating layer 3 made of a nonphotosensitive resin is then formed on LSI chip 1 (step (2), FIG. 3(a)). Thereafter, insulating layer 3 above externally connected pad 2 is irradiated with laser light, at position corresponding to externally connected pad 2, to remove insulating layer 3 so as to form via hole 4 passing through insulating layer 3 to the depth that allows externally connected pad 2 to be exposed (step (3), FIG. 3(b)). FIG. 4 is an enlarged view showing a portion in the vicinity of via hole 4 thus formed above externally connected pad 2. Thereafter, wiring layer 5 extending along insulating layer 3 through via hole 4 to externally connected pad 2 and electrically connected thereto is formed (step (4), FIG. 3(c)).

In the first method for manufacturing a semiconductor device, it is not necessary to form, for example, a laser stopper layer comprised of a stud bump, whereby the steps can be simplified. Further, a method for forming a via hole in the position in alignment with the externally connected pad by laser light irradiation can readily form a via hole, the following wiring formation can be readily carried out, and the pads can be provided at a high density.

In the first method for manufacturing a semiconductor device, the insulating layer made of a nonphotosensitive resin is formed on the LSI chip in the step (2). This step can be carried out not only by forming a nonphotosensitive resin layer on an upwardly oriented active surface (LSI element surface) of the LSI chip but also by mounting the LSI chip with the active surface thereof downwardly oriented on a nonphotosensitive resin that has been prepared in advance.

"Passing through the insulating layer to the depth that allows the externally connected pad to be exposed" in the step (3) described above means that the via hole is formed in such a way that the via hole is deep enough to reach externally connected pad 2, that is, the via hole is open on externally connected pad 2 (the opening of the via hole exposes externally connected pad 2 to the outside).

Specifically, checking in advance the relationship between the number of laser beam shots and the depth of a via hole allows a via hole that having deep enough to expose the externally connected pad to be formed. In the first method for manufacturing a semiconductor device, the intensity and the amount of irradiation of the laser light used for via hole formation are controlled in the step (3) described above in such a way that the via hole is formed to the depth that allows the externally connected pad to be exposed. In this way, the damage to the externally connected pad due to the laser light becomes very small. The width and thickness of the wiring and the like in an underlying layer of an LSI and the like are smaller than those of the wiring formed on or in a printed wiring board by one or two magnitudes or even smaller. Therefore, laser-induced damage during via hole formation, which is not problematic in a wiring board, becomes a big problem in the wiring and the like in an underlying layer of an LSI. However, the damage to the wiring and LSI in an underlying layer can be very small by controlling the intensity and the amount of irradiation of the laser light as described above.

A second method for manufacturing a semiconductor device according to the present invention includes the following steps:

(A) a step of preparing a individually divided LSI chip including an externally connected pad;

(B) a step of forming an insulating layer made of a nonphotosensitive resin on the LSI chip;

(C) a step of irradiating a position on the insulating layer corresponding to the is externally connected pad with laser light, to form an opening in the insulating layer in such a way that part of the insulating layer is left in the position corresponding to the externally connected pad;

(D) a step of carrying out dry etching or wet etching at bottom of the opening, to remove the insulating layer left in the position corresponding to the externally connected pad, and then to form a via hole passing through the insulating layer so that the externally connected pad is exposed (E) a step of forming a wiring layer extending along the insulating layer through the via hole to the externally connected pad.

Figure 5:
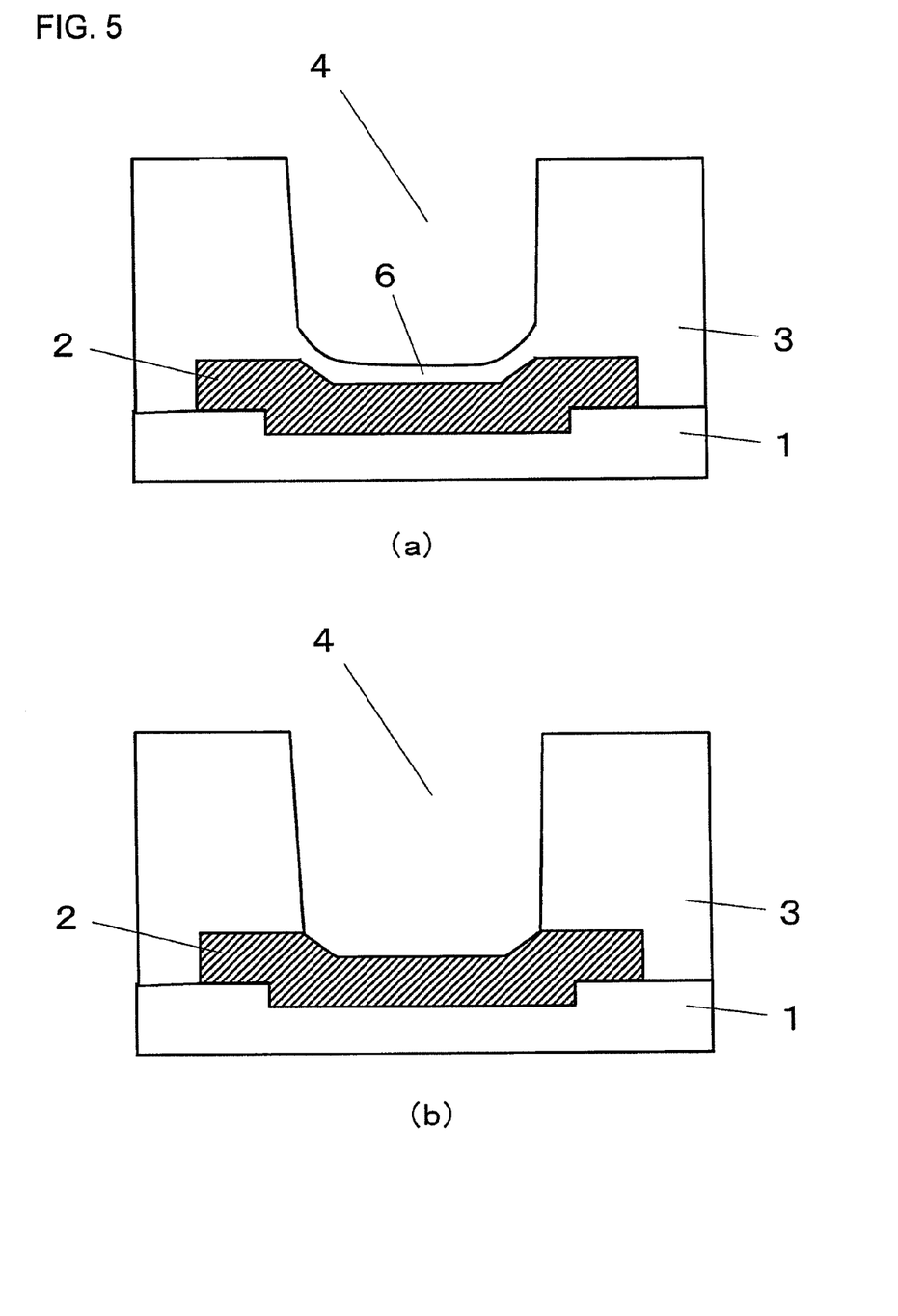
FIG. 5 shows another example of the method for manufacturing a semiconductor device according to the present invention.

FIG. 5 shows an example of the second method for manufacturing a semiconductor device. In the second method for manufacturing a semiconductor device, the steps (A) and (B) are carried out in the same manner as the steps (1) and (2) in the first method for manufacturing a semiconductor device.

In the step (C), laser light irradiation is carried out in such a way that nonphotosensitive resin 6 is left on at least part of the bottom of the via hole (Laser light irradiation is carried out in such a way that nonphotosensitive resin 6 is left in the position on the insulating layer that corresponds to the externally connected pad, FIG. 5(a)). Thereafter, dry etching or wet etching is carried out against remaining nonphotosensitive resin 6 to remove resin 6 left on the bottom of the via hole (step (D), FIG. 5(b)).

In the second method for manufacturing a semiconductor device, since the resin is left on the bottom of the via hole, the laser energy is not directly transferred to the externally connected pad, whereby the damage to the underlying layer can be suppressed.

In the step (C), the laser irradiation for via hole formation can be minimized. That is, to prevent the wiring and the like under the externally connected pad from being damaged, the laser light irradiation is stopped to leave the nonphotosensitive resin on the bottom of the via hole, and the slightly left nonphotosensitive resin is removed by dry etching, wet etching, or any other moderate method that does not greatly affect the LSI wiring or the underlying layer. Examples of the dry etching may include ashing using $O_2$, $N_2$, Ar, $CF_4$, and the like, IBE (Ion Beam Etching), and RIE (Reactive Ion Etching). In the wet etching, chemicals and the like for oxidizing and removing resins used for desmearing and the like can be used.

In the step (A) in the second method for manufacturing a semiconductor device, the prepared externally connected pad preferably includes an Al layer primarily containing Al and a TiN layer provided as an overlying layer on the Al layer. The material primarily containing Al is a material the Al content of which is at least 50% in terms of atomic ratio. Al—Si, Al—Cu, Al—Si—Cu, and other aluminum alloys can be used as well as Al alone. In this case, the laser light irradiation in the step (C) is carried out in such a way that part of the insulating layer and the entire TiN layer are left. Thereafter, dry etching is preferably carried out to remove the remaining insulating layer and TiN layer so that the Al layer of the externally connected pad is exposed. In this manufacturing method, since the TiN layer is present until the TiN layer is removed by the dry etching, the externally connected pad comprised of the Al layer primarily containing Al can be protected from the damage during the via hole formation.

In this manufacturing method, the damage to the layer under the externally connected pad due to the laser irradiation can be reduced by stopping the laser irradiation in a state in which the TiN layer leaves. Further, desmearing and other processes can be readily carried out by leaving the TiN layer, which is resistant to a desmearing solution, on the Al, which is less resistant to the desmearing solution. As a result, a via hole is formed by carrying out dry etching to open the remaining insulating layer and TiN layer, and then the externally connected pad can be electrically connected to external wiring. The method described above can provide a semiconductor device with excellent reliability at a high yield. The TiN layer can be formed as part of a typical semiconductor front-end step or a similar sputtering step.

The semiconductor device of the present invention can be used as a device in which a chip used in a mobile phone, an electric apparatus, and the like is built in a substrate.

While the present invention has been described with reference to the above exemplary embodiment, the present invention is not limited thereto. A variety of changes that the skilled in the art can understand can be made to the configuration and details of the present invention within the technical scope of the present invention.

The present application claims the priority based on Japanese Patent Application No. 2007-18141 filed on Jan. 29, 2007, the disclosure of which is hereby incorporated in its entirety.

The invention claimed is:

1. A method for manufacturing a semiconductor device, comprising:
   (A) preparing a individually divided LSI chip including an externally connected pad;
   (B) forming an insulating layer made of a nonphotosensitive resin on the LSI chip;
   (C) irradiating a position on the insulating layer corresponding to the externally connected pad with laser light, to form an opening in the insulating layer in such a way that part of the insulating layer is left in the position corresponding to the externally connected pad;
   (D) carrying out dry etching or wet etching at bottom of the opening, to remove the insulating layer left in the position corresponding to the externally connected pad, and then to form a via hole passing through the insulating layer so that the externally connected pad is exposed
   (E) forming a wiring layer extending along the insulating layer through the via hole to the externally connected pad.

2. The method for manufacturing a semiconductor device according to claim 1,
   wherein the externally connected pad includes an Al layer primarily containing Al and a TiN layer provided as an overlying layer on the Al layer, and
   in step (D), the dry etching is carried out to remove the insulating layer and the TiN layer and then to expose the Al layer of the externally connected pad.

3. The method for manufacturing a semiconductor device according to claim 1,
   wherein the externally connected pad includes a layer primarily containing Al.

4. The method for manufacturing a semiconductor device according to claim 1,
   wherein the externally connected pad includes a layer primarily containing Cu.

5. The method for manufacturing a semiconductor device according to claim 1,
   wherein the externally connected pad includes the same surface as a reference surface of the LSI chip.

6. The method for manufacturing a semiconductor device according to claim 1,
   wherein the entire externally connected pad is located on a LSI chip side under a reference surface of the LSI chip.

7. The method of manufacturing a semiconductor device according to claim 1,
   wherein part of the externally connected pad is located on a LSI chip side under a reference surface of the LSI chip.

* * * * *

UNITED STATES PATENT AND TRADEMARK OFFICE
CERTIFICATE OF CORRECTION

| | |
|---|---|
| PATENT NO. | : 8,043,953 B2 |
| APPLICATION NO. | : 12/521936 |
| DATED | : October 25, 2011 |
| INVENTOR(S) | : Hideya Murai et al. |

Page 1 of 1

It is certified that error appears in the above-identified patent and that said Letters Patent is hereby corrected as shown below:

Cover page item (73), should read: NEC CORPORATION, Tokyo (JP)
Renesas Electronics Corporation, Kanagawa (JP)

Signed and Sealed this
Thirty-first Day of July, 2012

David J. Kappos
*Director of the United States Patent and Trademark Office*